(12) United States Patent
Liao et al.

(10) Patent No.: US 7,924,353 B2
(45) Date of Patent: Apr. 12, 2011

(54) PIXEL STRUCTURE AND ACTIVE DEVICE ARRAY SUBSTRATE

(75) Inventors: Hsin-Ming Liao, Hsinchu (TW); Kuo-Yu Huang, Hsinchu (TW); Han-Tu Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 394 days.

(21) Appl. No.: 12/168,165

(22) Filed: Jul. 7, 2008

(65) Prior Publication Data

US 2009/0262269 A1    Oct. 22, 2009

(30) Foreign Application Priority Data

Apr. 22, 2008  (TW) ............................... 97114707 A

(51) Int. Cl.
  *G02F 1/1343* (2006.01)
(52) U.S. Cl. ............................ 349/38; 349/43
(58) Field of Classification Search .................. None
  See application file for complete search history.

(56) References Cited

U.S. PATENT DOCUMENTS

| 6,597,415 | B2 | 7/2003 | Rho et al. |
| 6,919,945 | B2 | 7/2005 | Ha |
| 2002/0001048 | A1* | 1/2002 | Lee et al. ......................... 349/43 |
| 2004/0104879 | A1* | 6/2004 | Lu .................................... 345/92 |
| 2006/0119753 | A1* | 6/2006 | Luo et al. ......................... 349/38 |
| 2008/0099764 | A1* | 5/2008 | Choi et al. ....................... 257/59 |

FOREIGN PATENT DOCUMENTS

| CN | 1515943 | 7/2004 |
| CN | 101154670 | 4/2008 |
| JP | 7-013197 | 1/1995 |

OTHER PUBLICATIONS

"1st Office Action of China counterpart application", issued on Jun. 5, 2006, p. 1-p. 11.
"2nd Office of China counterpart application", issued on Oct. 16, 2009, p. 1-p. 11.

* cited by examiner

*Primary Examiner* — Hemang Sanghavi
(74) *Attorney, Agent, or Firm* — Jianq Chyun IP Office

(57) ABSTRACT

A pixel structure is disposed on a substrate and electrically connected to a scan line and a data line. The pixel structure including an active device, a bottom capacitor electrode, an insulator, and a pixel electrode is provided. The active device is disposed on the substrate and has a gate, a source and a drain. Besides, the active device is electrically connected to the scan line and the data line. The bottom capacitor electrode and the gate are separately disposed on the substrate. The insulator covering the active device and the bottom capacitor electrode is made of a mono film. The pixel electrode is electrically connected to the active device, and at least a part of the pixel electrode extends to the insulator above the bottom capacitor electrode.

20 Claims, 8 Drawing Sheets

PIXEL STRUCTURE AND ACTIVE DEVICE ARRAY SUBSTRATE

CROSS-REFERENCE TO RELATED APPLICATION

This application claims the priority benefit of Taiwan application serial no. 97114707, filed Apr. 22, 2008. The entirety of the above-mentioned patent application is hereby incorporated by reference herein and made a part of this specification.

BACKGROUND OF THE INVENTION

1. Field of the Invention

The present invention is related to a pixel and a liquid crystal display (LCD) panel. More particularly, the present invention is related to an active device array substrate and a pixel structure having a storage capacitor.

2. Description of Related Art

With advantages of high definition, small volume, light weight, low voltage drive, low power consumption, and a wide range of applications, an LCD has replaced a cathode ray tube (CRT) display to become the mainstream display product in the next generation. In general, an LCD panel includes an active device array substrate, a color filter substrate, and a liquid crystal layer.

Specifically, the active device array substrate includes a plurality of thin film transistors (TFTs) arranged in array and pixel electrodes respectively corresponding to the TFTs, for example. Here, the TFTs serve as switches for turning an LCD unit on or off. Additionally, each pixel structure is individually controlled by a certain scan line and a certain data line. Through enabling the certain scan line and the certain data line by supplying appropriate operational voltages, data corresponding to the certain pixel structure can be displayed. Practically, to ensure the holding of the operational voltage applied to each of the pixel structures and to further improve display quality, the scan line or a common line is often covered by a part of a pixel electrode in each of the pixel structures, so as to form a storage capacitor.

FIG. 1A is a top view of a conventional pixel structure, while FIG. 1B is a schematic view alone a cross-sectional line A-B depicted in FIG. 1A. Referring to FIGS. 1A and 1B, in a conventional pixel structure 10, a storage capacitor C is mainly formed by coupling a common line 30 and a pixel electrode 40 disposed above the common line 30. In addition, a gate insulator 50 and a passivation layer 60 are formed between the common line 30 and the pixel electrode 40, so as to form the storage capacitor C having an MII-type structure composed of Metal layer/Insulator/Indium Tin Oxide (ITO) layer. The storage capacitor C is generally used for stabilizing a data voltage of the pixel structure 10 and for improving the display quality of the LCD. The data voltage of the pixel structure 10 can be stabilized to a better extent when a storage capacitance Cst reaches a relatively great value.

Referring to FIG. 1B, a method for increasing the storage capacitance Cst of the pixel structure 10 is performed by extending an overlapping area of the common line 30 and the pixel electrode 40, whereas an aperture of the pixels is prone to be reduced by performing said method. As such, luminance of images that are displayed by the LCD may be insufficient.

On the other hand, the storage capacitance Cst of the pixel structure 10 can also be increased by extending an area of an electrode or reducing a thickness of the insulator. In detail, even though the storage capacitance Cst can be increased by extending the overlapping area of the common line 30 and the pixel electrode 40, the aperture of the pixels is inevitably reduced, thus negatively affecting the image display effect and the image display quality.

Given that it is intended to increase the storage capacitance Cst in the conventional pixel structure 10 without sacrificing the aperture, the total thickness of the gate insulator 50 and the passivation layer 60 must be reduced, such that the storage capacitance Cst in the conventional pixel structure 10 can be increased. It is also possible for the storage capacitor C of the pixel structure 10 to have an increased value by performing an etching process on a channel layer, so as to simultaneously reduce the thickness of the gate insulator 50. Nevertheless, the gate insulator 50 of the storage capacitor C is apt to be etched unevenly, which deteriorates device characteristics of the storage capacitor C.

SUMMARY OF THE INVENTION

The present invention is directed to a pixel structure which is able to better stabilize a data voltage and maintain a certain aperture of the pixel structure.

The present invention is further directed to an active device array substrate which is conducive to better stabilizing a data voltage applied to a pixel structure and maintain a certain aperture of the pixel structure.

The present invention provides a pixel structure disposed on a substrate and electrically connected to a scan line and a data line. The pixel structure includes an active device, a bottom capacitor electrode, an insulator, and a pixel electrode. The active device is disposed on the substrate and has a gate, a source and a drain. Besides, the active device is electrically connected to the scan line and the data line. The bottom capacitor electrode and the gate are separately disposed on the substrate. The insulator covering the active device and the bottom capacitor electrode is made of a mono film. The pixel electrode is directly disposed on the insulator and electrically connected to the active device. Besides, at least a part of the pixel electrode extends to the insulator above the bottom capacitor electrode.

The present invention further provides an active device array substrate including a substrate, a common line, a plurality of scan lines, a plurality of data lines, and a plurality of pixel structures. The common line, the plurality of scan lines, and the plurality of data lines are disposed on the substrate. The pixel structures are disposed on the substrate and electrically connected to the corresponding scan lines and the corresponding data lines, respectively. Each of the pixel structures includes an active device, a bottom capacitor electrode, an insulator, and a pixel electrode. The active device is disposed on the substrate and has a gate, a source, and a drain. In addition, the active device is electrically connected to the corresponding scan line and the corresponding data line. The bottom capacitor electrode and the gate are separately disposed on the substrate. The insulator covering the active device and the bottom capacitor electrode is made of a mono film. The pixel electrode is directly disposed on the insulator and electrically connected to the active device. Besides, at least a part of the pixel electrode extends to the insulator above the bottom capacitor electrode.

According to an embodiment of the present invention, the insulator has an opening exposing a part of the drain, and the pixel electrode is electrically connected to the drain through the opening of the insulator.

According to an embodiment of the present invention, the gate and the bottom capacitor electrode are formed in the same film layer.

According to an embodiment of the present invention, the gate forms a first conductor layer, the source and the drain form a second conductor layer, and the bottom capacitor electrode is a stacked layer composed of the first conductor layer and the second conductor layer.

According to an embodiment of the present invention, the pixel electrode is directly in contact with the substrate.

According to an embodiment of the present invention, the insulator is directly in contact with the substrate, and the pixel electrode is disposed on the insulator.

According to an embodiment of the present invention, the active device includes a bottom-gate TFT.

According to an embodiment of the present invention, the gate forms a first conductor layer, the source and the drain form a second conductor layer, and the first conductor layer and the second conductor layer respectively have different etching rates so as to form a selectivity ratio when the first conductor layer and the second conductor layer are etched by a certain etchant. According to an embodiment of the present invention, the etching selectivity ratio of the second conductor layer to the first conductor layer is greater than 9:1.

According to an embodiment of the present invention, the active device further includes a gate insulator covering the gate, and the gate insulator and the insulator are in different film layers.

According to an embodiment of the present invention, a part of the common line constitutes the bottom capacitor electrodes.

The present invention further provides an active device array substrate including a substrate, a common line, a plurality of scan lines, a plurality of data lines, and a plurality of pixel structures. The common line, the plurality of scan lines, and the plurality of data lines are disposed on the substrate. The pixel structures are disposed on the substrate and electrically connected to the corresponding scan lines and the corresponding data lines, respectively. Each of the pixel structures includes an active device, a bottom capacitor electrode, an insulator, and a pixel electrode. The active device is disposed on the substrate and has a gate, a source, and a drain. In addition, the active device is electrically connected to the corresponding scan line and the corresponding data line. The bottom capacitor electrode and the gate are separately disposed on the substrate. The insulator directly covers the active device and the bottom capacitor electrode. Here, the insulator is directly in contact with the substrate. The pixel electrode is directly disposed on the insulator and electrically connected to the active device.

The present invention further provides an active device array substrate including a substrate, a common line, a plurality of scan lines, a plurality of data lines, and a plurality of pixel structures. The common line, the plurality of scan lines, and the plurality of data lines are disposed on the substrate. The pixel structures are disposed on the substrate and electrically connected to the corresponding scan lines and the corresponding data lines, respectively. Each of the pixel structures includes an active device, a bottom capacitor electrode, an insulator, and a pixel electrode. The active device is disposed on the substrate and has a gate, a source, and a drain. In addition, the active device is electrically connected to the corresponding scan line and the corresponding data line. The bottom capacitor electrode and the gate are separately disposed on the substrate. The insulator directly covers the active device and the bottom capacitor electrode. The pixel electrode is electrically connected to the active device and directly covers the insulator. Here, the pixel electrode is directly in contact with the substrate.

According to an embodiment of the present invention, a material of the insulator includes silicon nitride, silicon oxide, or silicon oxynitride.

According to an embodiment of the present invention, the gates form a first conductor layer, the sources and the drains form a second conductor layer, and the bottom capacitor electrodes form a stacked layer composed of the first conductor layer and the second conductor layer.

In the storage capacitor of the active device array substrate and the pixel structure set forth in the present invention, one single film layer serves as the insulator between an upper capacitor electrode and the bottom capacitor electrode, and no etching process is performed on the insulator. Therefore, in comparison with the related art, the deterioration of the device characteristics of the storage capacitor due to uneven etching can be prevented in the present invention. Meanwhile, the storage capacitance can be increased while the aperture of the pixel structure and the aperture of the active device array substrate stay unchanged. As such, the display quality of the LCD is improved.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
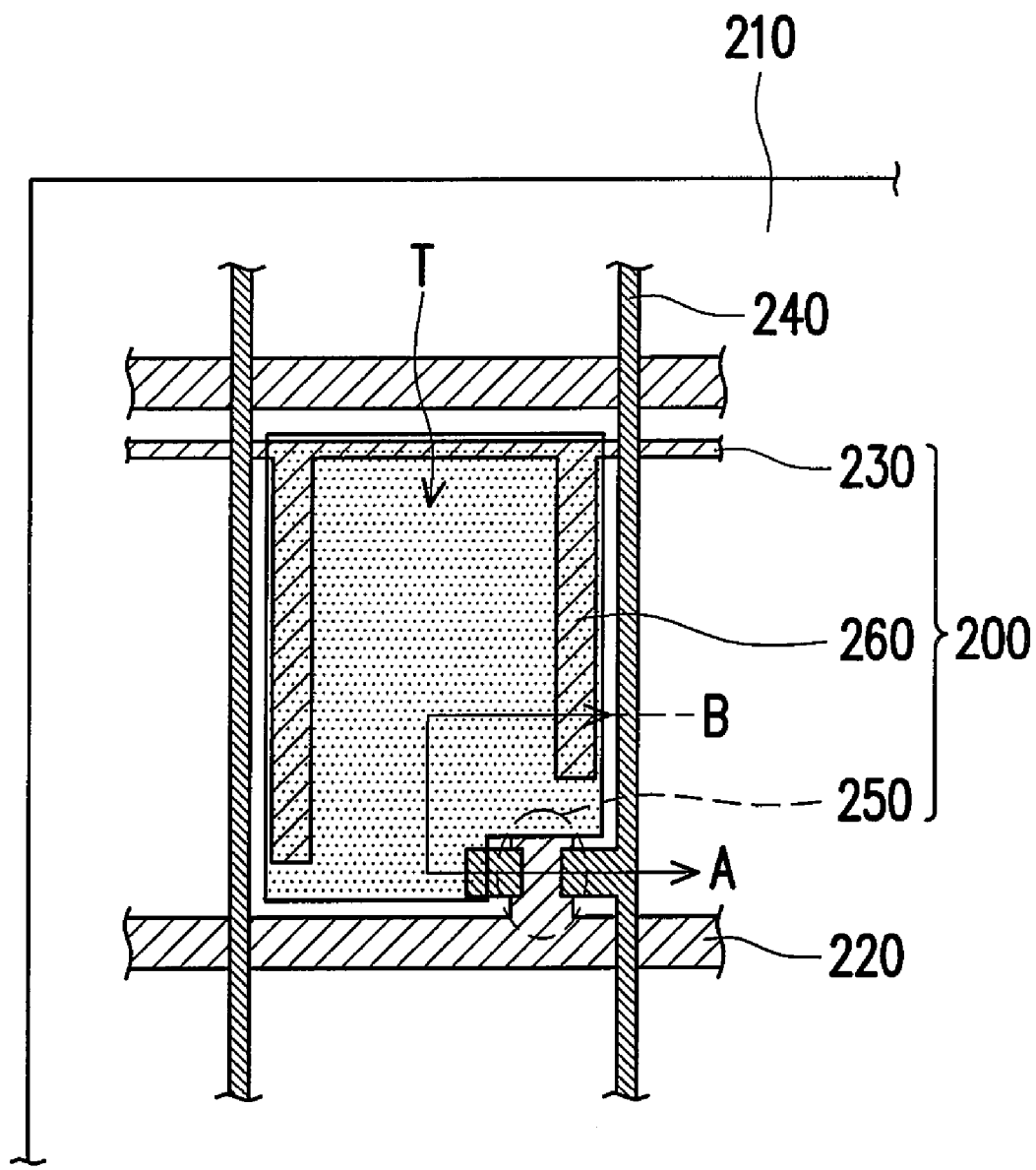
FIG. 2 is a schematic view of a pixel structure according to an embodiment of the present invention.
Figure 3A:
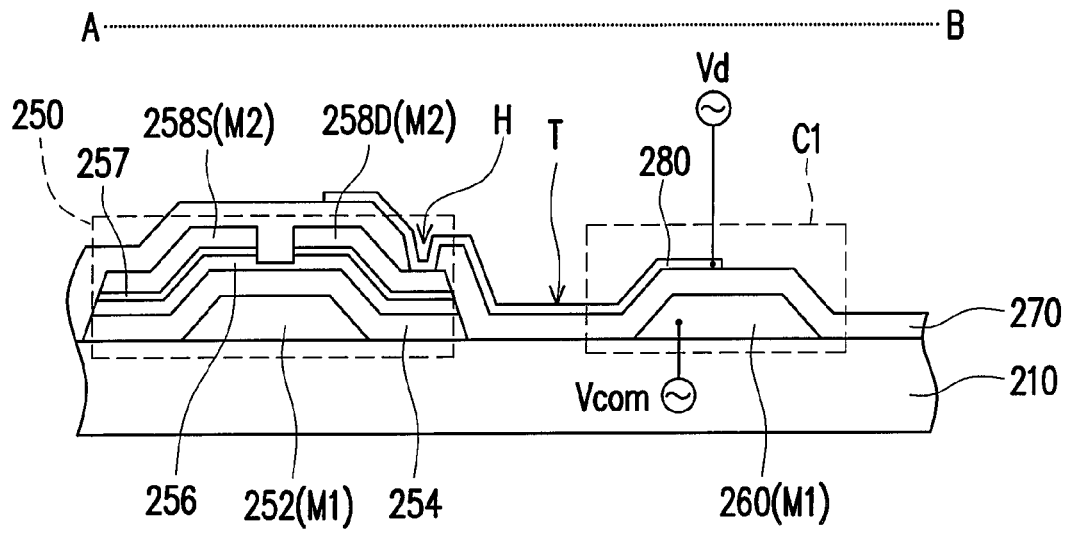
FIG. 3A is a schematic cross-sectional view of the pixel structure depicted in FIG. 2 and taken along a cross-sectional line A-B.

FIG. 2 is a schematic view of a pixel structure according to an embodiment of the present invention. FIG. 3A is a schematic cross-sectional view of the pixel structure depicted in FIG. 2 and taken along a cross-sectional line A-B. Referring to FIGS. 2 and 3A, a pixel structure 200 of the present embodiment is disposed on a substrate 210 which is a glass substrate, a plastic substrate, or a substrate made of other materials, for example. The pixel structure 200 is electrically connected to a scan line 220 and a data line 240 and is mainly composed of an active device 250, a bottom capacitor electrode 260, an insulator 270, and a pixel electrode 280. In the present embodiment, the pixel structure 200 further includes a common line 230, and a part of the common line 230 constitutes the bottom capacitor electrode 260.

As shown in FIGS. 2 and 3A, the active device 250 is driven by the corresponding scan line 220 and the corresponding data line 240. In detail, the active device 250 is, for example, a bottom-gate TFT, and the active device 250 is mainly composed of a gate 252, a gate insulator 254 covering the gate 252, a channel layer 256 disposed above the gate 252, a source 258S, and a drain 258D. The gate 252 and the source 258S are electrically connected to the scan line 220 and the data line 240, respectively, while the drain 258D is electrically connected to the pixel electrode 280. In the present embodiment, the bottom capacitor electrode 260 and the gate 252 are in the same film layer but are electrically insulated from each other. In addition, according to the present embodiment, an ohmic contact layer 257 can be selectively formed between the channel layer 256 and the source 258S and between the channel layer 256 and the drain 258D, so as to reduce the contact resistance between the channel layer 256 and the source 258S and between the channel layer 256 and the drain 258D.

Referring to FIG. 3A, the bottom capacitor electrode 260 and the gate 252 are separately disposed on the substrate 210, and the insulator 270 covers the active device 250 and the bottom capacitor electrode 260. Note that the insulator 270 of the present embodiment directly covers the bottom capacitor electrode 260. Here, a material of the insulator 270 includes silicon nitride, silicon oxide, or silicon oxynitride. It should be mentioned that the insulator 270 covering the active device 250 and the gate insulator 254 covering the gate 252 in the active device 250 are in different film layers, and the insulator 270 is made of a mono film. In addition, the insulator 270 has an opening H exposing a part of the drain 258D, such that the pixel electrode 280 disposed on the insulator 270 is electrically connected to the drain 258D through the opening H. Meanwhile, at least a part of the pixel electrode 280 extends to the insulator 270 above the bottom capacitor electrode 260.

As indicated in FIG. 3A, the bottom capacitor electrode 260 and the part of the pixel electrode 280 are coupled through the insulator 270 to form a storage capacitor C1. Here, the storage capacitor C1 has an MII-type structure composed of Metallic layer-Insulator-ITO layer. Specifically, the part of the pixel electrode 280 that is disposed above the bottom capacitor electrode 260 acts as an upper capacitor electrode of the storage capacitor C1. As the pixel structure 200 is applied to an LCD panel, a voltage level of the pixel electrode 280 is controlled by the active device 250, so as to input a data voltage Vd through the data line 240. On the other hand, a voltage level of the bottom capacitor electrode 260 can be controlled by inputting a common voltage Vcom through the common line 230. As such, the part of the pixel electrode 280, the insulator 270, and the bottom capacitor electrode 260 together form the storage capacitor C1.

Figure 1A:
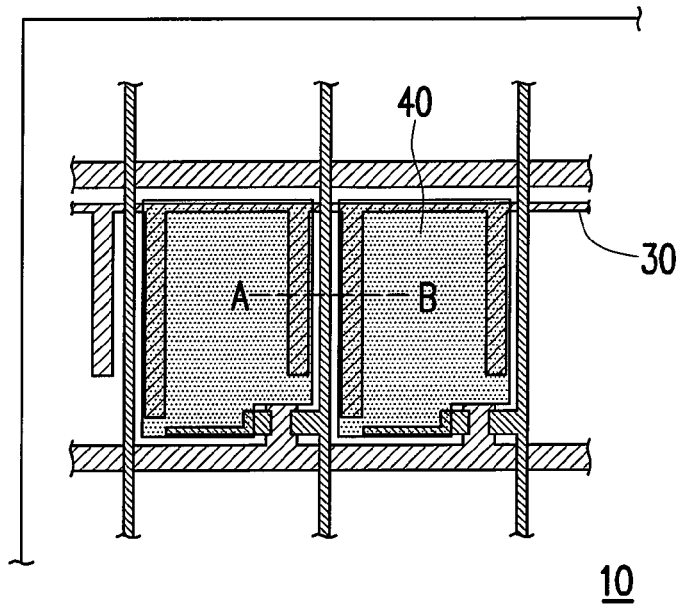
FIG. 1A is a top view of a conventional pixel structure.
Figure 1B:
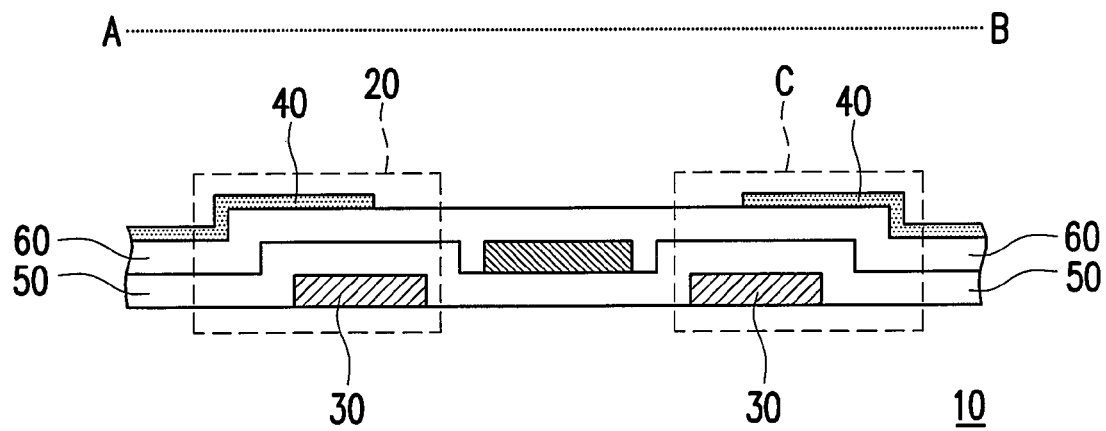
FIG. 1B is a schematic view along a cross-sectional line A-B of FIG. 1A.

Note that only the insulator 270 made of the mono film is interposed between the pixel electrode 280 and the bottom capacitor electrode 260 in the present invention. Hence, in comparison with the related art as shown in FIG. 1B, the pixel electrode 280 and the bottom capacitor electrode 260 are disposed in a relatively close distance, such that the storage capacitor C1 of the present invention is able to have a comparatively large value when the coupling area of the storage capacitor C1 is the same as that provided in the related art. Moreover, the insulator 270 of the storage capacitor C1 is not the conventional gate insulator 50 depicted in FIG. 1B. Therefore, it is possible to effectively prevent the insulator 270 from being damaged during an implementation of an etching process on the channel layer 256. The operational characteristics of the storage capacitor C1 are thus maintained.

Figure 3B:
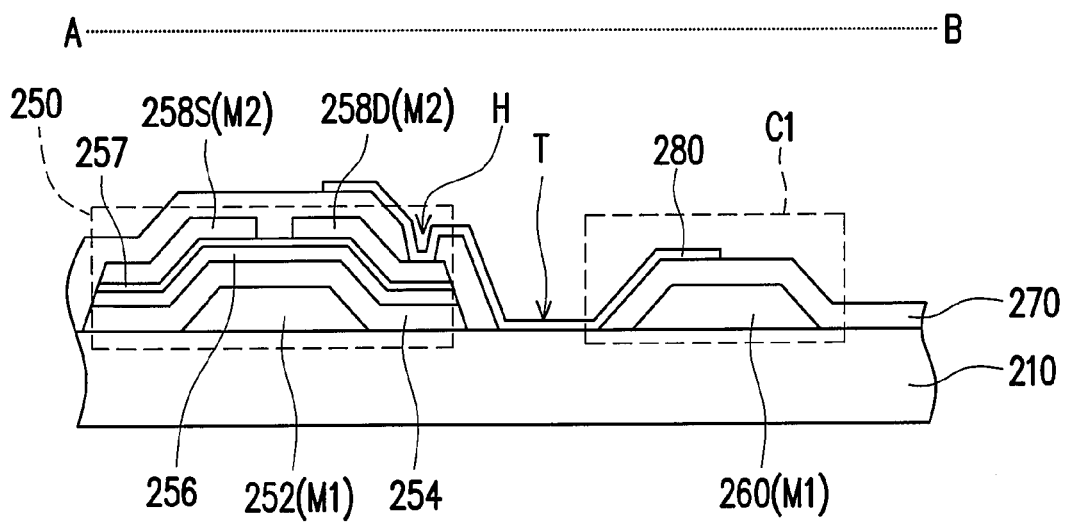
FIG. 3B is another schematic cross-sectional view of the pixel structure depicted in FIG. 2 and taken along the cross-sectional line A-B.

Referring to FIGS. 2 and 3A together, the pixel structure 200 has a transparent region T. In the present embodiment, the insulator 270 is directly in contact with the substrate 210 disposed within the transparent region T, while the pixel electrode 280 is directly disposed on the insulator 270. A method for fabricating the pixel structure 200 is elaborated hereinafter with reference to FIGS. 4A through 4D. To further improve a transmittance rate of the pixel structure 200, the cross-sectional structure of the film layers located within the transparent region T of the pixel structure 200 can be arranged as shown in FIG. 3B that is another schematic cross-sectional view of the pixel structure depicted in FIG. 2 and taken along the cross-sectional line A-B. Referring to FIGS. 2 and 3B, the pixel electrode 280 can also be directly located on the substrate 210 within the transparent region T. In other words, the insulator 270 disposed on the transparent region T is removed, such that the pixel electrode 280 is directly in contact with the substrate 210.

Figure 3C:
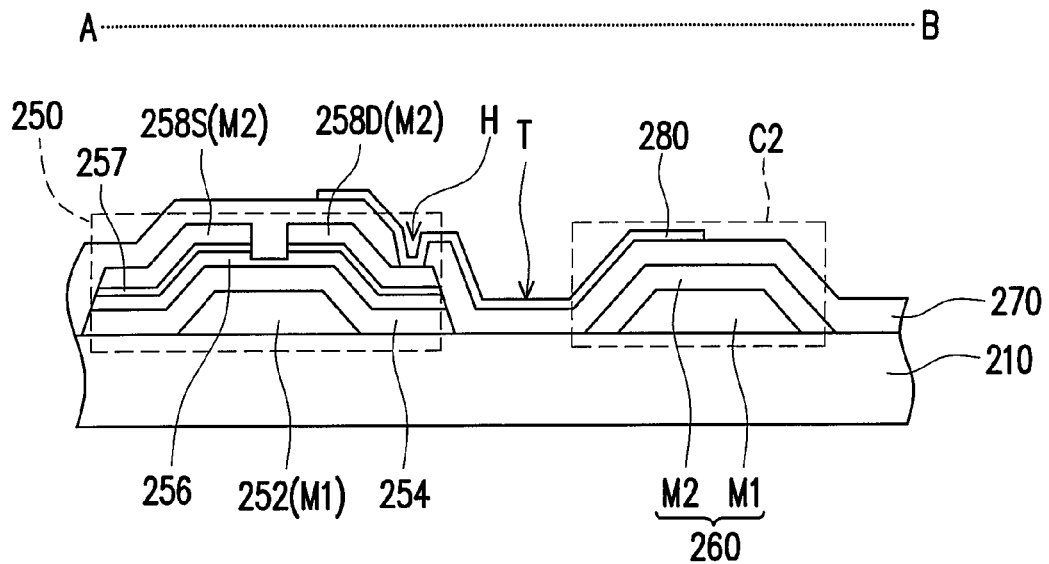
FIG. 3C is still another schematic cross-sectional view of the pixel structure depicted in FIG. 2 and taken along the cross-sectional line A-B.

It is of certainty that the upper capacitor electrode and the bottom capacitor electrode 260 are electrically insulated from each other because of the disposition of the insulator 270 in the storage capacitor C1 of the pixel structure 200. Here, the upper capacitor electrode is mainly composed of a part of the pixel electrode 280. Note that the bottom capacitor electrode 260 can be either a single conductor layer as indicated in FIGS. 3A and 3B or a plurality of conductor layers stacked to one another. FIG. 3C is still another schematic cross-sectional view of the pixel structure depicted in FIG. 2 and taken along the cross-sectional line A-B. Referring to FIG. 3C, the bottom capacitor electrode 260 can have the same structure as that of the gate 252, the source 258S, and the drain 258D. In detail, according to the present embodiment, the gate 252 forms a first conductor layer M1, the source 258S and the drain 258D form the second conductor layer M2, and the bottom capacitor electrode 260 is a stacked layer composed of the first conductor layer M1 and the second conductor layer M2. Here, the part of the pixel electrode 280, the insulator 270, and the bottom capacitor electrode 260 can together form another storage capacitor C2. The bottom capacitor electrode 260 composed of the stacked conductor layers is conducive to increasing the conductivity of the bottom capacitor electrode 260 and bringing up the signal transmission rate, such as the transmission of said common voltage Vcom.

Figure 3D:
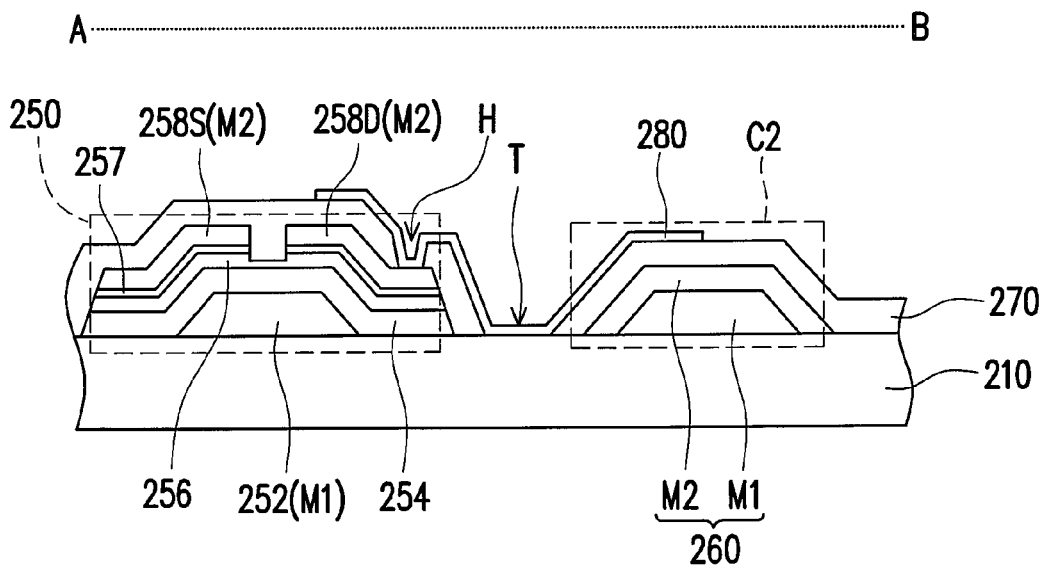
FIG. 3D is yet still another schematic cross-sectional view of the pixel structure depicted in FIG. 2 and taken along the cross-sectional line A-B.

It should be mentioned that the insulator 270 in the transparent region T of the pixel structure 200 depicted in FIG. 3C is directly in contact with the substrate 210, while the pixel electrode 280 is directly disposed on the insulator 270. The cross-sectional structure of the transparent region T of the pixel structure 200 can certainly be arranged as depicted in FIG. 3D that is yet still another schematic cross-sectional view of the pixel structure 200 depicted in FIG. 2 and taken along the cross-sectional line A-B. Referring to FIGS. 2 and 3D, the pixel electrode 280 can also be directly disposed on the substrate 210 within the transparent region T, so as to further improve the transmission rate of the pixel structure 200.

The pixel structure 200 of the present invention is depicted in FIGS. 3A through 3D which are the schematic cross-sectional views of the pixel structure 200. Without sacrificing the aperture ration, the storage capacitors C1 and C2 of the pixel structure 200 are able to reach a relatively great value. The insulator 270 in the storage capacitors C1 and C2 is made of the mono film and is different from the gate insulator 254. A process for manufacturing the pixel structure 200 depicted in FIG. 3A is taken as an embodiment for elaborating the present invention to a better extent, while the embodiment does not pose a limitation on the way to fabricate the pixel structure of the present invention.

Figure 4A:
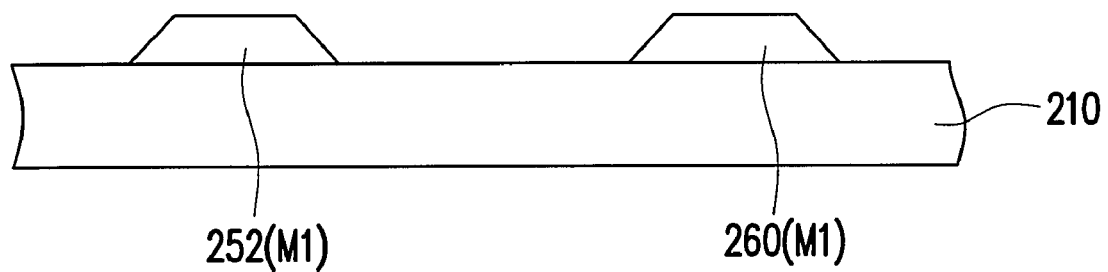
FIGS. 4A through 4D are schematic cross-sectional flowcharts illustrating a process for fabricating the pixel structure depicted in FIG. 3A.

FIGS. 4A through 4D are schematic cross-sectional flowcharts illustrating a process for fabricating the pixel structure depicted in FIG. 3A. Referring to FIG. 4A, a substrate 210 is provided at first, and a material of the substrate 210 includes glass, plastic, and other solid or soft materials. Next, the gate 252 and the bottom capacitor electrode 260 are formed on the substrate 210. The gate 252 and the bottom capacitor electrode 260 can be formed by first forming the first conductor layer M1 on the entire substrate 210, and the first conductor layer M1 is then patterned to form the gate 252 and the bottom capacitor electrode 260. Here, the first conductor layer M1 is patterned by implementing photolithography and etching processes, for example.

Figure 4B:
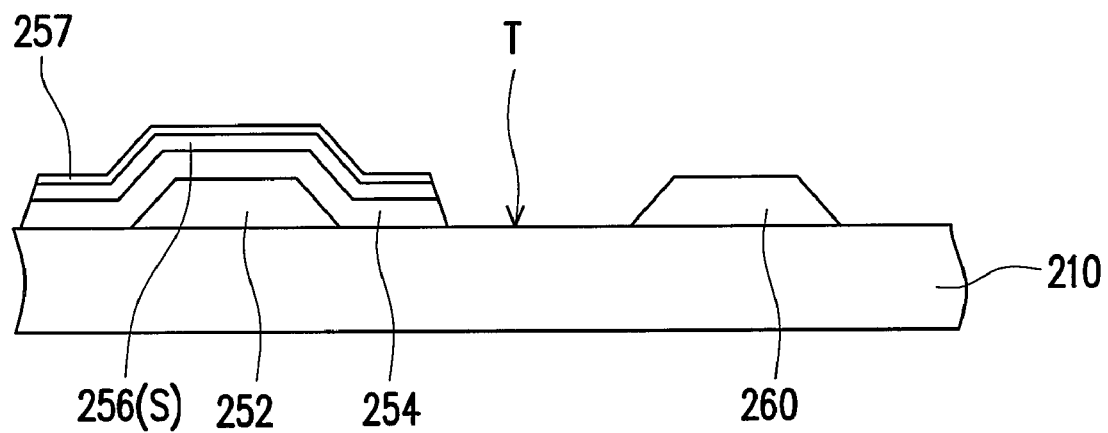

Thereafter, referring to FIG. 4B, the gate insulator 254, a semiconductor layer S, and the ohmic contact layer 257 are formed on the substrate 210 to cover the gate 252 and the bottom capacitor electrode 260. The gate insulator 254 is formed by performing a chemical vapor deposition (CVD) process or other appropriate thin film depositing processes, for example. A material of the gate insulator 254 includes, for example, dielectric materials, such as silicon oxide, silicon nitride, silicon oxynitride, and so forth. Moreover, a material of the semiconductor layer S is, for example, amorphous silicon or other semiconductor materials. Besides, in the ohmic contact layer 257, a doping process, such as an ion doping process, is performed on the amorphous silicon for forming heavily N-doped amorphous silicon.

After that, referring to FIG. 4B, the semiconductor layer S and the ohmic contact layer 257 are patterned, such that the channel layer 256 is formed above the gate 252. The gate insulator 254, the semiconductor layer S, and the ohmic contact layer 257 outside a predetermined area of the TFT to be formed are then removed by implementing a dry etching process, for example. Different from the related art, the bottom capacitor electrode 260 and a surface of the substrate 210 in the transparent region T are exposed in the present invention after the gate insulator 254 is patterned.

Figure 4C:
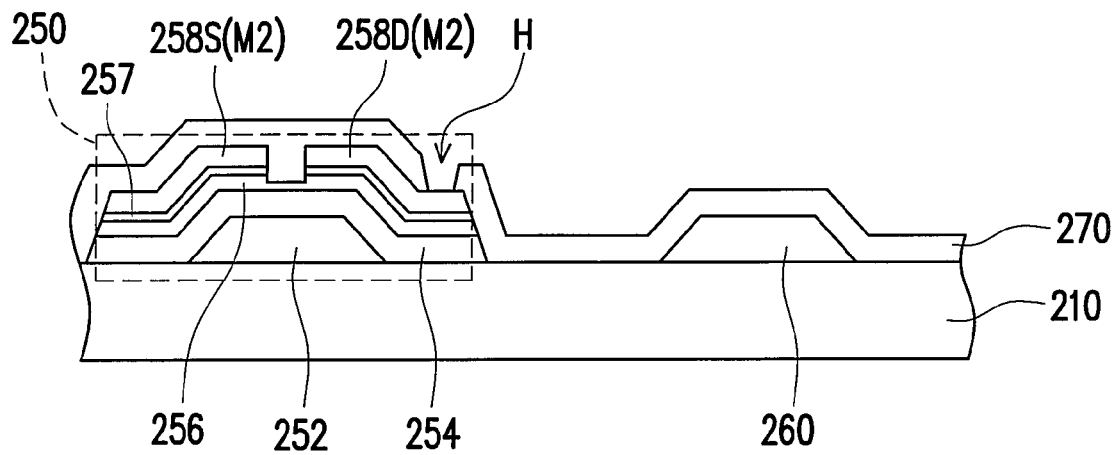

Next, referring to FIG. 4C, the source 258S and the drain 258D are formed on the channel layer 256 at respective sides of the gate 252. Here, a method for forming the source 258S and the drain 258D includes first forming the second conductor layer M2 on the channel layer 256 and the gate insulator 254, and the second conductor layer M2 is then patterned by performing the photolithography process and a wet etching process in sequence, for example. Note that the selected material of the second conductor layer M2 can have a comparatively great etching selectivity ratio in comparison with the material of the first conductor layer M1 (illustrated in FIG. 4A). Specifically, the material of the second conductor layer M2 can be selected according to a certain etchant used in the etching process having a higher etching selectivity ratio than that of the material of the first conductor layer M1 depicted in FIG. 4A. The etching selectivity ratio of the second conductor layer M2 to the first conductor layer M1 is substantially greater than 9:1. More particularly, provided that the first conductor layer M1 is made of chromium or titanium, for example, the material of the second conductor layer M2 is selected from aluminum or an aluminum neodymium (AlNd) alloy. In an alternative, given that the first conductor layer M1 is made of aluminum or the AlNd alloy, the material of the second conductor layer M2 is selected from chromium or titanium. The gate 252, the channel layer 256, the source 258S, and the drain 258D together constitute a TFT which is the aforesaid active device 250.

Afterwards, referring to FIG. 4C, the active device 250 and the bottom capacitor electrode 260 are covered by the insulator 270 which has the opening H exposing a part of the drain 258D. Here, the material of the insulator 270 can be inorganic dielectric materials, such as silicon nitride, silicon oxide, silicon oxynitride, and so forth. Besides, the insulator 270 can be formed by thoroughly depositing the inorganic dielectric material on the substrate 210 through the implementation of a physical vapor deposition (PVD) process or the CVD process.

Figure 4D:
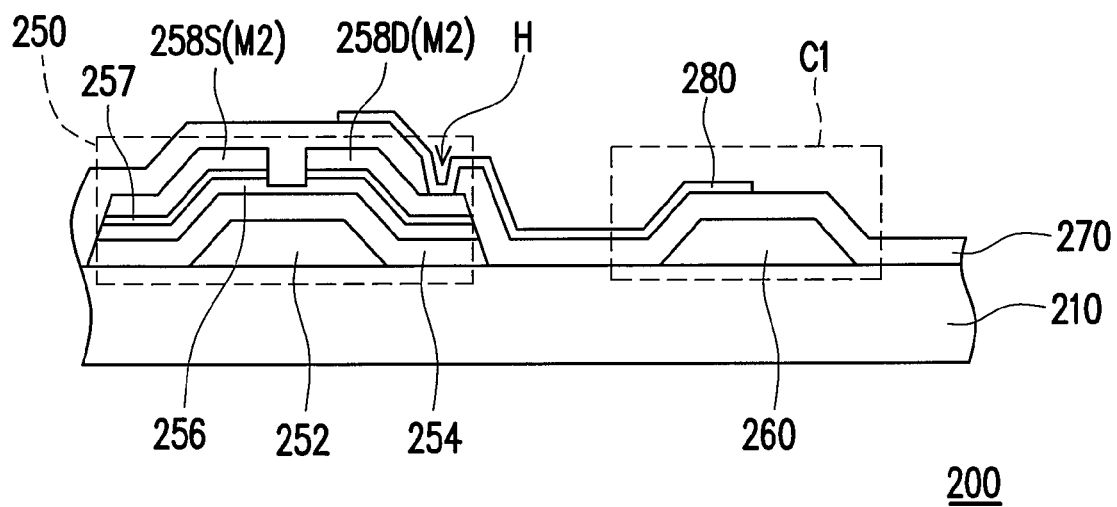

Thereafter, as shown in FIG. 4D, the pixel electrode 280 is formed on the insulator 270. At least a part of the pixel electrode 280 extends to the insulator 270 above the bottom capacitor electrode 260, such that the bottom capacitor electrode 260, the insulator 270, and the pixel electrode 280 together form the storage capacitor C1 having the MII-type structure composed of Metal layer/Insulator/ITO layer. The pixel electrode 280 is, for example, formed by fabricating an electrode material layer on the entire substrate 210 at first, and then the electrode material layer is patterned (not shown). Here, the electrode material layer is, for example, manufactured by performing a sputtering process, so as to form an ITO layer or an indium zinc oxide (IZO) layer.

Figure 5:
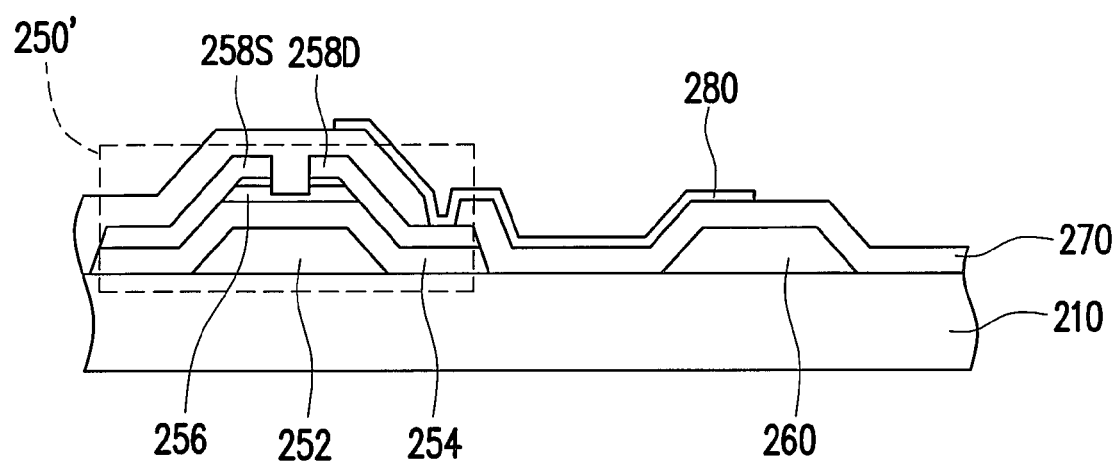
FIG. 5 is yet still another schematic cross-sectional view of the pixel structure depicted in FIG. 2 and taken along a cross-sectional line A-B.

It should be noted that the present invention poses no limitation on the types of the active device. For instance, the active device of the present invention can be the TFT as depicted in FIGS. 3A through 3D or as depicted in FIG. 5. In detail, an edge of the source 258S and an edge of the drain 258D in the TFT illustrated in FIGS. 3A through 3D are aligned to an edge of the channel layer 256. Here, the edge of the source 258S and the edge of the drain 258D are away from the gate 252. By contrast, in an active device 250' illustrated in FIG. 5, the channel layer 256 is positioned within the gate 252, and the source 258S and the drain 258D cover the edge of the channel layer 256 and extend to the gate insulator 254. Here, the edge of the channel layer 256 is away from the gate 252. That is to say, in the present embodiment, the channel layer 256 has an island-in structure, which is not limited in the present invention.

Figure 6:
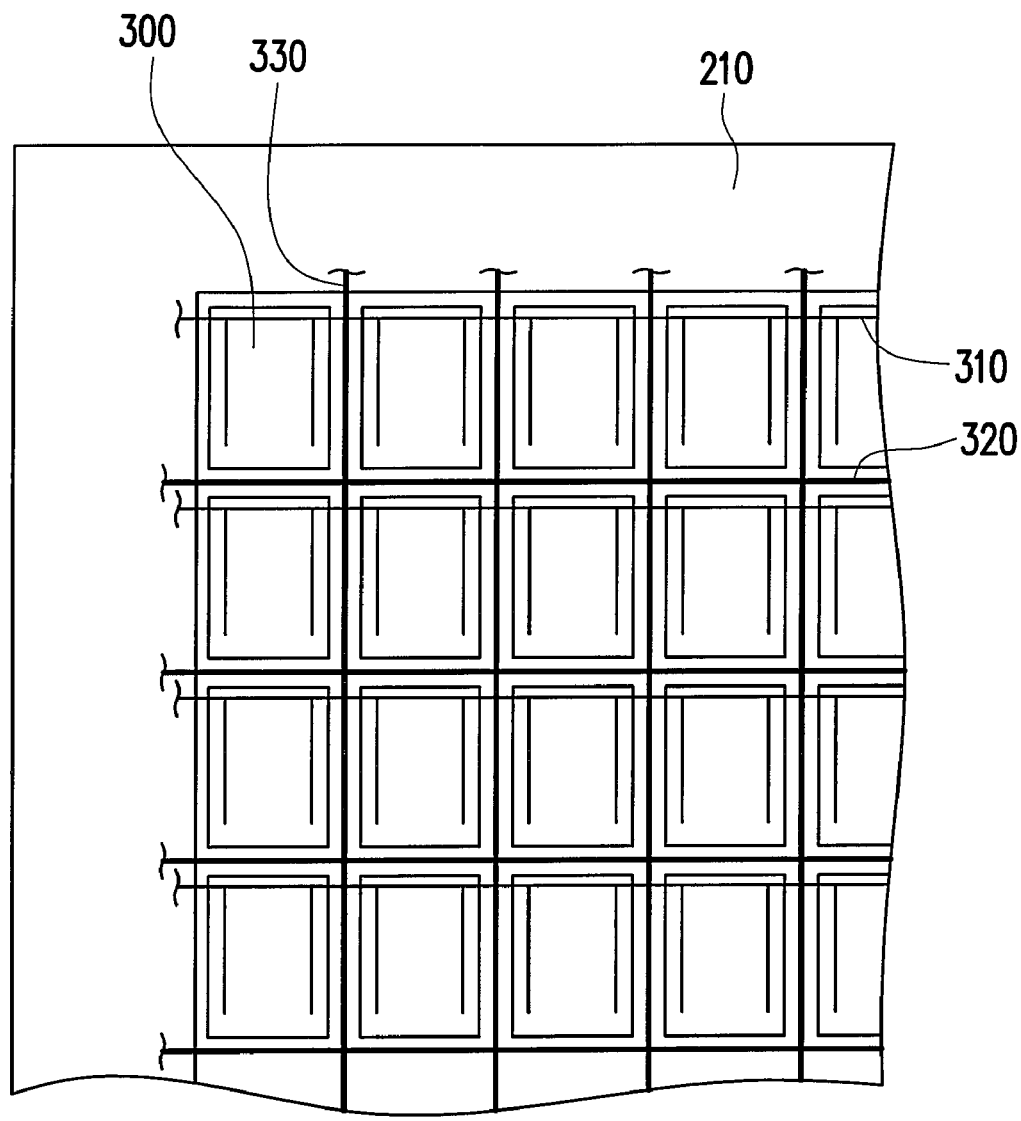
FIG. 6 is a schematic view of an active device array substrate according to an embodiment of the present invention.

FIG. 6 is a schematic view of an active device array substrate according to an embodiment of the present invention. As indicated in FIG. 6, the active device array substrate mainly includes a common line 310, a plurality of scan lines 320, a plurality of data lines 330, and a plurality of pixel structures 300. The pixel structures 300 are arranged in array on the substrate 210 and can be referred to as the pixel structure 200 as described in any of the above-mentioned embodiments. It should be noted that the storage capacitor C1 of the pixel structure 200 as provided in the above-mentioned embodiments is configured in a π shape substantially (as shown in FIG. 2). However, with reference to the disclosure of the present invention, people skilled in the pertinent art are likely to modify the layout shape of the storage capacitor, the orientation of the storage capacitor, or the components of the TFT in a proper manner, which is not limited in the present invention.

In view of the above, the pixel structure and the active device array substrate of the present invention have at least the following advantages:

The storage capacitance and the aperture ratio of the pixel structure and the active device array substrate can be further increased according to the present invention.

The processes for fabricating the pixel structure and the active device array substrate of the present invention are compatible with existing processes. As a result, the storage capacitance per unit area can be effectively increased without significantly adjusting the existing manufacturing processes.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A pixel structure, disposed on a substrate and electrically connected to a scan line and a data line, the pixel structure comprising:
    an active device, disposed on the substrate, comprising a gate, a gate insulator covering the gate, a source and a drain, the active device being electrically connected to the scan line and the data line;
    a bottom capacitor electrode, wherein the bottom capacitor electrode and the gate are separately disposed on the substrate, and the bottom capacitor electrode is uncovered by the gate insulator;
    an insulator, covering the active device and the bottom capacitor electrode, wherein the insulator is made of a mono film; and
    a pixel electrode, directly disposed on the insulator and electrically connected to the active device, wherein at least a part of the pixel electrode extends to the insulator above the bottom capacitor electrode.

2. The pixel structure as claimed in claim 1, wherein the insulator has an opening that exposes a part of the drain, the pixel electrode is electrically connected to the drain through the opening of the insulator, and the gate and the bottom capacitor electrode is in the same film layer.

3. The pixel structure as claimed in claim 1, wherein the gate forms a first conductor layer, the source and the drain form a second conductor layer, and the bottom capacitor electrode is a stacked layer.

4. The pixel structure as claimed in claim 1, wherein the pixel electrode is directly in contact with the substrate.

5. The pixel structure as claimed in claim 1, wherein the insulator is directly in contact with the substrate, and the pixel electrode is disposed on the insulator.

6. The pixel structure as claimed in claim 1, wherein the gate forms a first conductor layer, the source and the drain form a second conductor layer, the first conductor layer and the second conductor layer respectively have different etching rates so as to form a selectivity ratio when the first conductor layer and the second conductor layer are etched by an etchant, and the etching selectivity ratio of the second conductor layer to the first conductor layer is greater than 9:1.

7. The pixel structure as claimed in claim 1, wherein the gate insulator and the insulator are in different film layers.

8. An active device array substrate, comprising:
    a substrate;
    a common line, disposed on the substrate;
    a plurality of scan lines and a plurality of data lines, disposed on the substrate; and
    a plurality of pixel structures, disposed on the substrate and electrically connected to the corresponding scan lines and the corresponding data lines, wherein each of the pixel structures comprises:
        an active device, disposed on the substrate, comprising a gate, a gate insulator covering the gate, a source and a drain, the active device being electrically connected to the corresponding scan line and the corresponding data line;
        a bottom capacitor electrode, wherein the bottom capacitor electrode and the gate are separately disposed on the substrate, and the bottom capacitor electrode is uncovered by the gate insulator;
        an insulator, covering the active device and the bottom capacitor electrode, wherein the insulator is made of a mono film; and
        a pixel electrode, directly disposed on the insulator and electrically connected to the active device, wherein at least a part of the pixel electrode extends to the insulator above the bottom capacitor electrode.

9. The active device array substrate as claimed in claim 8, wherein for each of the pixel structures, the insulator has an opening that exposes a part of the drain, the pixel electrode is electrically connected to the drains through the opening, and the gate and the bottom capacitor electrode are in the same film layer.

10. The active device array substrate as claimed in claim 8, wherein the gates form a first conductor layer, the sources and the drains form a second conductor layer, and the bottom capacitor electrodes form a stacked layer.

11. The active device array substrate as claimed in claim 8, wherein each of the pixel electrodes is directly in contact with the substrate.

12. The active device array substrate as claimed in claim 8, wherein each of the insulators is directly in contact with the substrate, and each of the pixel electrodes is disposed on one of the insulators.

13. The active device array substrate as claimed in claim 8, wherein the gates form a first conductor layer, the sources and the drains form a second conductor layer, the first conductor layer and the second conductor layer respectively have different etching rates so as to form a selectivity ratio when the first conductor layer and the second conductor layer are etched by an etchant, and the etching selectivity ratio of the second conductor layer to the first conductor layer is greater than 9:1.

14. The active device array substrate as claimed in claim 8, wherein the gate insulator and the insulator are in different film layers.

15. An active device array substrate, comprising:
    a substrate;
    a common line, disposed on the substrate;
    a plurality of scan lines and a plurality of data lines, disposed on the substrate; and
    a plurality of pixel structures, disposed on the substrate and electrically connected to the corresponding scan lines and data lines, wherein each of the pixel structures comprises:
        an active device, disposed on the substrate, comprising a gate, a source and a drain, the active device being electrically connected to the corresponding scan line and the corresponding data line;
        a bottom capacitor electrode, wherein the bottom capacitor electrode and the gate are separately disposed on the substrate;
        an insulator, directly covering the active device and the bottom capacitor electrode, wherein the insulator is directly in contact with the substrate; and
        a pixel electrode, directly disposed on the insulator and electrically connected to the active device.

16. The active device array substrate as claimed in claim 15, wherein a material of the insulator comprises silicon nitride, silicon oxide, or silicon oxynitride.

17. The active device array substrate as claimed in claim 15, wherein the gate forms a first conductor layer, the source and the drain form a second conductor layer, and the bottom capacitor electrode is a stacked layer.

18. An active device array substrate, comprising:

a substrate;

a common line, disposed on the substrate;

a plurality of scan lines and a plurality of data lines, disposed on the substrate; and a plurality of pixel structures, disposed on the substrate and electrically connected to the corresponding scan lines and data lines, wherein each of the pixel structures comprises:

an active device, disposed on the substrate, comprising a gate, a source and a drain, the active device being electrically connected to the corresponding scan line and the corresponding data line;

a bottom capacitor electrode, wherein the bottom capacitor electrode and the gate are separately disposed on the substrate;

an insulator, directly covering the active device and the bottom capacitor electrode; and a pixel electrode, electrically connected to the active device and directly covering the insulator, wherein the pixel electrode is directly in contact with the substrate.

19. The active device array substrate as claimed in claim 18, wherein a material of the insulator comprises silicon nitride, silicon oxide, or silicon oxynitride.

20. The active device array substrate as claimed in claim 18, wherein the gate forms a first conductor layer, the source and the drain form a second conductor layer, and the bottom capacitor electrode is a stacked layer.

* * * * *